US008835303B2

(12) United States Patent
Feustel et al.

(10) Patent No.: US 8,835,303 B2
(45) Date of Patent: Sep. 16, 2014

(54) METALLIZATION SYSTEM OF A SEMICONDUCTOR DEVICE COMPRISING EXTRA-TAPERED TRANSITION VIAS

(75) Inventors: Frank Feustel, Dresden (DE); Thomas Werner, Moritzburg (DE); Kai Frohberg, Niederau (DE)

(73) Assignee: Advanced Micro Devices, Inc., Austin, TX (US)

( * ) Notice: Subject to any disclaimer, the term of this patent is extended or adjusted under 35 U.S.C. 154(b) by 849 days.

(21) Appl. No.: 12/634,216

(22) Filed: Dec. 9, 2009

(65) Prior Publication Data

US 2010/0164121 A1 Jul. 1, 2010

(30) Foreign Application Priority Data

Dec. 31, 2008 (DE) .......................... 10 2008 063 430

(51) Int. Cl.
*H01L 21/4763* (2006.01)
*H01L 21/768* (2006.01)

(52) U.S. Cl.
CPC .... *H01L 21/76807* (2013.01); *H01L 21/76804* (2013.01); *H01L 21/76813* (2013.01)
USPC .................. 438/618; 438/627; 257/E21.579; 257/E21.584; 257/E21.585

(58) Field of Classification Search
CPC .................. H01L 2221/1036; H01L 23/5226; H01L 23/53238
USPC ......... 438/618, 624–627, 634, 637, 638, 668, 438/672; 257/E21.579, E21.584, E21.585
See application file for complete search history.

(56) References Cited

U.S. PATENT DOCUMENTS

| | | | | |
|---|---|---|---|---|
| 4,902,377 A | | 2/1990 | Berglund et al. ............. | 156/643 |
| 6,025,259 A | * | 2/2000 | Yu et al. ........................ | 438/618 |
| 6,239,017 B1 | | 5/2001 | Lou et al. ...................... | 438/624 |
| 6,586,329 B1 | | 7/2003 | Tanaka et al. ................. | 438/629 |
| 6,861,347 B2 | * | 3/2005 | Lee et al. ....................... | 438/622 |
| 7,112,532 B2 | * | 9/2006 | Ali et al. ....................... | 438/700 |
| 7,179,734 B2 | * | 2/2007 | Keum ........................... | 438/623 |
| 2003/0186538 A1 | | 10/2003 | Lee et al. ...................... | 438/637 |
| 2007/0126121 A1 | | 6/2007 | Shue et al. .................... | 257/774 |

FOREIGN PATENT DOCUMENTS

DE 102006025405 A1 12/2007 ............ H01L 21/768

OTHER PUBLICATIONS

Translation of Official Communication from German Patent Office for German Patent Application No. 10 2008 063 430.1 dated Dec. 4, 2009.

* cited by examiner

*Primary Examiner* — David Vu
(74) *Attorney, Agent, or Firm* — Williams Morgan, P.C.

(57) ABSTRACT

In a metallization system of a semiconductor device, a transition via may be provided with an increased degree of tapering by modifying a corresponding etch sequence. For example, the resist mask for forming the via opening may be eroded once or several times in order to increase the lateral size of the corresponding mask opening. Due to the pronounced degree of tapering, enhanced deposition conditions may be accomplished during the subsequent electrochemical deposition process for commonly filling the via opening and a wide trench connected thereto.

25 Claims, 6 Drawing Sheets

METALLIZATION SYSTEM OF A SEMICONDUCTOR DEVICE COMPRISING EXTRA-TAPERED TRANSITION VIAS

BACKGROUND OF THE INVENTION

1. Field of the Invention

Generally, the present disclosure relates to microstructures, such as advanced integrated circuits, and, more particularly, to conductive structures, such as copper-based metallization layers, comprising wide metal lines connected to closely spaced narrow metal lines by transition vias.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area as typically the number of interconnections required increases more rapidly than the number of circuit elements. Thus, a plurality of stacked "wiring" layers, also referred to as metallization layers, is usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like.

Advanced integrated circuits, including transistor elements having a critical dimension of 0.05 μm and even less, may, therefore, typically be operated at significantly increased current densities of up to several kA per cm$^2$ in the individual interconnect structures, despite the provision of a relatively large number of metallization layers, owing to the significant number of circuit elements per unit area. Consequently, well-established materials, such as aluminum, are being replaced by copper and copper alloys, a material with significantly lower electrical resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less than desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed to separate the bulk copper from the surrounding dielectric material, thereby reducing copper diffusion into the dielectric materials and also reducing the diffusion of unwanted species, such as oxygen, fluorine and the like, into the copper. Furthermore, the conductive barrier layers may also provide highly stable interfaces with the copper, thereby reducing the probability for significant material transport at the interface, which is typically a critical region in view of increased diffusion paths that may facilitate current-induced material diffusion. Currently, tantalum, titanium, tungsten and their compounds with nitrogen and silicon and the like are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, thereby requiring a process strategy that is commonly referred to as the damascene or inlaid technique. In the damascene process, first, a dielectric layer is formed, which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less in combination with trenches having a width ranging from 0.1 μm to several μm. Electrochemical deposition processes for copper are well established in the field of electronic circuit board fabrication. However, for the dimensions of the metal regions in semiconductor devices, the void-free filling of high aspect ratio vias is an extremely complex and challenging task, wherein the characteristics of the finally obtained copper-based interconnect structure significantly depend on process parameters, materials and geometry of the structure of interest. Since the basic geometry of interconnect structures is substantially determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure to insure both high yield and the required product reliability.

In addition to achieve high production yield and superior reliability of the metallization system, it is also important to achieve production yield and reliability on the basis of a high overall throughput of the manufacturing process under consideration. For instance, the so-called dual damascene process is frequently used, in which a via opening and a corresponding trench are filled in a common deposition sequence, thereby providing superior process efficiency. Due to a complex layout of sophisticated metallization systems, the metal lines of two adjacent metallization layers may have a very different lateral size, since metal lines of one layer may have to be adapted to a moderately high packing density of corresponding interconnect structures, while the trenches in the adjacent metallization layer may have to provide a high current drive capability. In this case, the vertical interconnection between a metal line with an increased width to a metal line having a significantly smaller width may have to be established on the basis of a via that corresponds to the trench having the significantly reduced width. A manufacturing regime according to the dual damascene strategy may, however, result in significant irregularities during the deposition of the copper material due to the significant difference in their lateral width of the corresponding trench and the via, as will be explained in more detail with reference to FIGS. 1a-1b.

FIG. 1a schematically illustrates a cross-sectional view of a semiconductor device 100 at a manufacturing stage in which a complex metallization system 130 is to be formed above a substrate 101. It should be appreciated that the substrate 101 may comprise a plurality of circuit elements, such as transistors and the like, which may be formed on the basis of design dimensions of approximately 50 nm and less, if sophisticated applications are considered. For convenience, any such circuit elements are not shown in FIG. 1a. The metallization system 130 comprises a metallization layer 110, which may represent any of a plurality of metallization layers, wherein the number of corresponding metallization layers may depend on the complexity of the circuit layout of the device 100. For instance, the metallization layer 110 comprises a dielectric material 111, which may include a low-k dielectric material in order to reduce the parasitic capacitance between adjacent metal lines 112, which, at least in the portion shown in FIG. 1a, may represent closely spaced metal lines as may be required by the overall circuit layout. For instance, the metal lines 112 may have a width 112W of approximately 100 nm and less, and the distance between an adjacent two of the metal lines 112 may be of a similar order of magnitude. As previously discussed, the metal lines may be formed on the basis of a copper material in combination with a conductive barrier material 112B in order to provide the required copper confinement and the electromigration behavior, as discussed above. Furthermore, an dielectric cap or etch stop layer 113 is typically provided on the dielectric material 111 and the metal lines 112, wherein the cap layer 113 may, depending on the overall process strategy, also provide copper confinement and superior interface characteristics with the metal lines 112. Furthermore, a metallization layer 120 is formed above the layer 110 and comprises a trench 121T and a via opening 121V formed in a corresponding dielectric material 121. For example, the dielectric material 121 may represent a low-k dielectric material or any other dielectric material, depending on requirements with respect to parasitic capacitance and the like. The trench 121T may have a significantly greater width 121W in order to provide sufficient current drive capability, which may be required in the metallization layer 120. On the other hand, the via opening 121V may connect to one of the metal lines 112 so that a corresponding width 121U substantially corresponds to the width 112W of the metal lines 112 in the metallization layer 110.

The semiconductor device 100 as illustrated in FIG. 1a may be formed on the basis of well-established manufacturing techniques. For example, after providing any circuit elements in the device level of the device 100 (not shown), an appropriate contact structure may be provided to connect to the circuit elements and provide a platform for forming thereon the metallization system 130. Thereafter, one or more metallization layers may be formed on the basis of process techniques as will be described with reference to the metallization layer 120. Thus, after forming the metallization layer 110 and depositing the cap layer 113 on the basis of well-established deposition techniques, such as chemical vapor deposition (CVD) and the like, in order to provide one or more materials, such as silicon carbide, nitrogen-containing silicon carbide and the like, the dielectric material 121 is deposited. For this purpose, any appropriate deposition technique may be used, depending on the composition of the material 121. Thereafter, various process strategies are typically used in order to form the via opening 121U and the trench 121T according to the design dimensions. For example, in a so-called "via first-trench last" approach, the via opening 121V may be formed by providing an etch mask, such as a resist mask, and etching the dielectric material 121 down to a specified depth or down to the etch stop layer 113. Next, a corresponding etch mask for the trench may be formed on the basis of sophisticated lithography techniques, wherein, if required, a corresponding planarization material may be deposited first in order to at least partially fill the via opening 121V, when extending down to the etch stop layer 113. Thereafter, a further etch process is performed to obtain the trench 121T and the etch mask may be removed, while the etch stop layer 113 is also opened so that the via opening 121V may extend into the metal line 112. Thereafter, any required manufacturing processes may be performed for preparing the device 100 for the deposition of a conductive barrier material.

For example, a barrier material 122B is deposited, for instance, in the form of a tantalum/tantalum nitride layer stack on the basis of sputter deposition and the like. Moreover, a seed material (not shown) may be deposited in order to enhance a subsequent electrochemical deposition process for filling in the copper material into the trench 121T and the via 121V. It should be appreciated that, due to the sophisticated device geometries caused by the wide trench 121T and the narrow via 121V, corresponding deposition parameters may have to be appropriately selected in order to reliably cover the exposed portions within the trench 121T and the via 121V with the barrier material 122B.

FIG. 1b schematically illustrates the semiconductor device 100 when subjected to an electrochemical deposition process for depositing copper material. As previously explained, in view of superior process efficiency, the trench 121T and the via 121V may be formed in an interrelated patterning process and the filling thereof may be accomplished on the basis of the common deposition process 102. However, the sophisticated device topography caused by the per se very complex electrochemical deposition of the copper material may result in deposition irregularities, such as voids 122C, thereby contributing to significant yield losses and reduced reliability of the resulting metallization system 130. That is, the electrochemical deposition of the copper material 122A may be based on highly complex electrolyte solutions including sophisticated additives in order to obtain, in combination with an appropriate pulse reverse regime in electroplating techniques, a bottom to top fill behavior. However, due to the significant difference in lateral dimensions of the trench 121T and the via 121V, a premature "closure" of the via opening 121V may result in a corresponding irregularity 122C.

In some conventional strategies, the probability of creating the deposition-related irregularities 122C may be reduced by redesigning the layout of the metallization layer 110 so that increased areas are provided at certain portions of the metal lines 112 so as to provide an increased lateral size of the "landing area" of the via 121V. However, a corresponding redesign may generally reduce overall packing density in the metallization system 130.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which the surface topography of a wide trench and a via opening connecting to a metal line of reduced lateral size may be "relaxed" by introducing a pronounced degree of tapering such that a desired reduced lateral width of the via opening may be obtained in the vicinity of the metal line of reduced lateral dimension, while the width of the opening may upwardly increase. Consequently, any constraints imposed on a common deposition process for filling the via opening having the pronounced tapering and the wide trench may be significantly reduced, without requiring dedicated design strategies, which may conventionally result in a reduced packing density. In some illustrative aspects disclosed herein, the pronounced tapering of the via may be accomplished by modifying the etch sequence for forming the via opening in the dielectric material by increasing a corresponding mask opening in a resist mask at least once during the patterning sequence. For instance, the resist material may be "eroded" after performing a first etch step and thereafter a further etch step may be performed on the basis of an increased lateral width of the mask opening. If required, further etch steps may be performed with preceding mask erosion processes in order to obtain a substantially gradual tapering of the resulting via opening. In other illustrative aspects disclosed herein, the etch process for forming the via opening may be performed on the basis of an appropriately designed initial etch mask for forming a first portion of the via opening, while a remaining depth of the via opening may be obtained on the basis of a spacer element, which may also result in a pronounced tapering of the finally obtained via opening.

One illustrative method disclosed herein comprises forming an etch mask above a dielectric material of a first metallization layer of a semiconductor device, wherein the etch mask comprises a mask opening having a first lateral size that corresponds to a target lateral size at a bottom of a via to be formed in the dielectric material. The method further comprises forming a via opening on the basis of the mask opening having the first lateral size in order to form the via opening so as to extend to the first depth in the dielectric material. Thereafter, the mask opening is increased to obtain a second lateral size thereof and the via opening is increased on the basis of the mask opening having the second lateral size so as to extend to a second depth. The method further comprises forming a trench above the via opening in the dielectric material so as to connect to the via opening. Finally, the method comprises commonly filling the via opening and the trench with a metal-containing material, wherein the via opening extends to a metal region of a second metallization layer located below the first metallization layer.

A further illustrative method disclosed herein comprises forming a via opening in a dielectric material of a first metallization layer of a semiconductor device, wherein the via opening extends to a first depth and has a first lateral size. Additionally, a spacer element is formed on sidewalls of the via opening and a depth of the via opening is increased so as to extend to a metal region of a second metallization layer that is formed below the first metallization layer.

One illustrative semiconductor device disclosed herein comprises a first metallization layer formed above a substrate, wherein the first metallization layer comprises a metal line having a first width. The semiconductor device further comprises a second metallization layer formed below the first metallization layer and comprising a second metal line having a second width that is less than the first width. Additionally, the semiconductor device comprises a via extending from the first metal line to the second metal line, wherein the via has a first lateral dimension at the first metal line and has a second lateral dimension at the second metal line, wherein the second lateral dimension is approximately 60% or less of the first lateral dimension.

BRIEF DESCRIPTION OF THE DRAWINGS

The disclosure may be understood by reference to the following description taken in conjunction with the accompanying drawings, in which like reference numerals identify like elements, and in which.

Figure 1A:
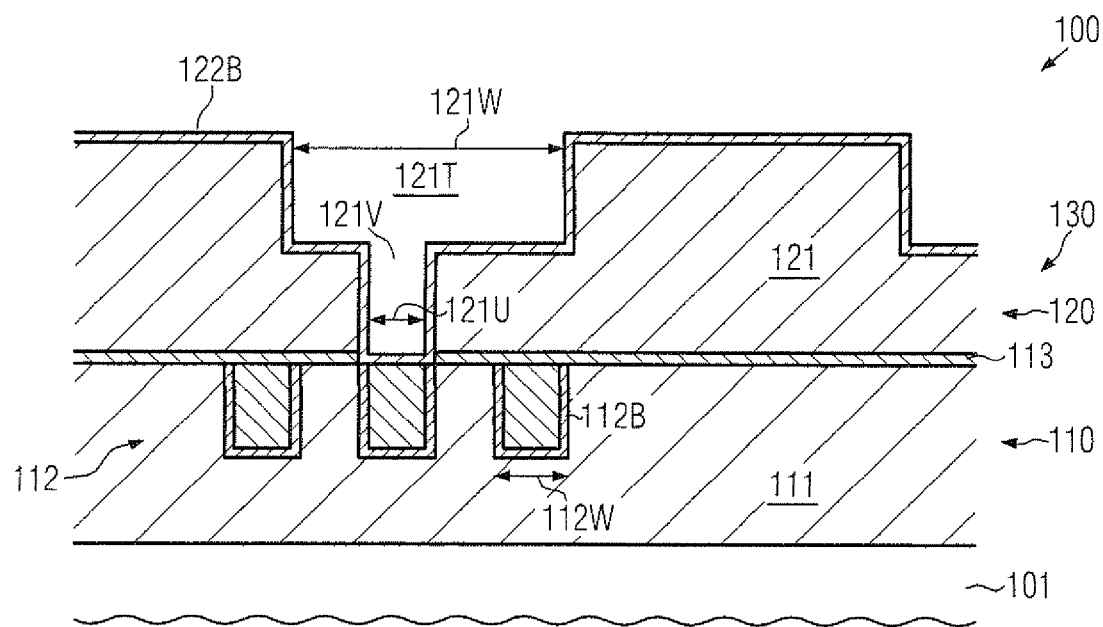
FIGS. 1a-1b schematically illustrate cross-sectional views of a sophisticated semiconductor device during various manufacturing stages in forming a metallization system on the basis of conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to manufacturing techniques and corresponding semiconductor devices in which interconnections between narrow metal lines and wide metal lines of adjacent metallization layers may be accomplished on the basis of vias having a pronounced tapering so that a bottom width thereof may be adapted to a design width of the narrow metal line, while the top of the via may have a significantly increased lateral dimension in order to provide enhanced device geometry during a common deposition process for filling the via opening and the corresponding trench of the metal line with a reduced probability of creating deposition-related irregularities. Consequently, corresponding vias of a pronounced tapering, which may also be referred to as transition vias, may be provided without requiring specifically provided increased "landing" areas connected to the narrow metal lines, thereby providing enhanced packing density and superior design flexibility in providing complex metallization systems. In some illustrative embodiments, the pronounced tapering of the transition vias may be accomplished by performing the etch sequence for patterning the via opening on the basis of a resist mask, which may intermittently be modified, for instance, by performing one or more material removal processes, so that an initial lateral size of a mask opening may be increased during the further advance of the overall etch sequence. In other illustrative embodiments, the etch sequence for forming the via opening in the dielectric material may be started with a desired lateral size at the top of the via opening and a desired reduced target dimension for the via bottom may be obtained on the basis of a spacer element, which may be formed at an intermediate phase of the overall patterning sequence. Consequently, during the further patterning process, the spacer element may also be removed, so that a corresponding configuration of the spacers may be transferred into the dielectric material, which may thus result in a corresponding tapered configuration. Consequently, a superior device geometry may be provided prior to the common deposition process, thereby not unduly contributing to the overall process complexity, while also avoiding specifically designed contact areas of increased lateral dimensions for the narrow metal lines. Hence, metal lines having a width of several hundred nanometers and even more may be reliably connected to metal lines of a lower-lying metallization layer having a width of approximately 100 nm and significantly less in sophisticated applications on the basis of an electrochemical deposition process. It should be appreciated, however, that, although the present disclosure is particularly advantageous in the context of sophisticated metallization systems with metal lines having dimensions in the above-specified range, the principles disclosed herein may nevertheless be applied to any other less critical metallization systems. Consequently, the present disclosure should not be considered as being restricted to any specific device dimensions, unless such restrictions are explicitly set forth in the specification or the appended claims.

Figure 1B:
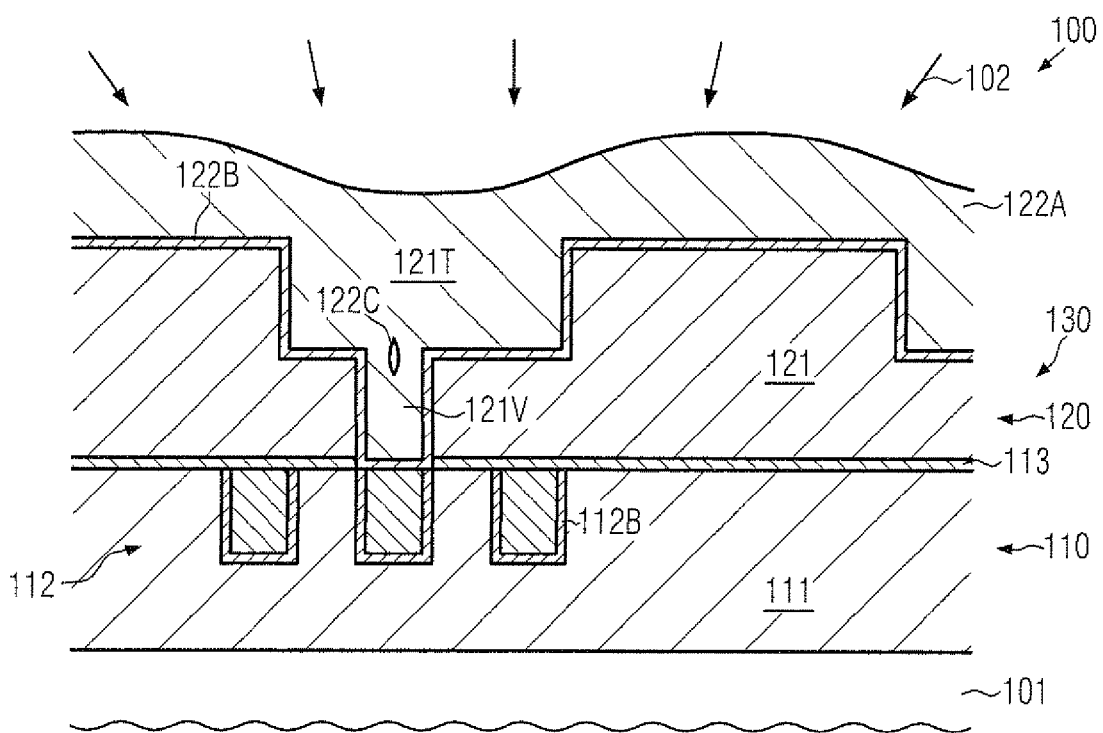

With reference to FIGS. 2a-2i, further illustrative embodiments will now be described in more detail, wherein reference may also be made to FIGS. 1a-1b if appropriate.

Figure 2A:
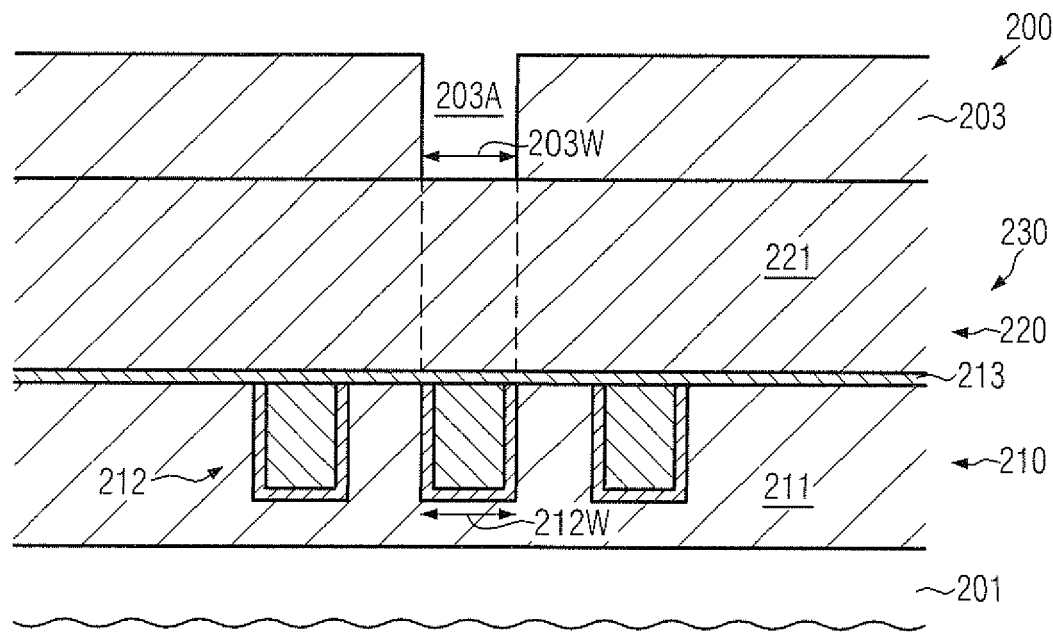
FIGS. 2a-2f schematically illustrate cross-sectional views of a semiconductor device during various manufacturing stages in forming a metallization system, in which a via having a pronounced tapering connects a narrow metal line to a wide metal line, according to illustrative embodiments.

FIG. 2a schematically illustrates a cross-sectional view of a semiconductor device 200 comprising a substrate 201, above which may be formed a metallization system 230. The metallization system 230 may comprise any number of metallization layers wherein, for convenience, a first metallization layer 220 and a second metallization layer 210 are illustrated in FIG. 2a. For example, in some illustrative embodiments, the metallization system 230 may represent an interconnect structure of a sophisticated semiconductor device, in which circuit elements (not shown) may have critical dimensions of approximately 50 nm and less. As previously explained with reference to the semiconductor device 100, corresponding circuit elements may be formed in and above an appropriate semiconductor material that may be positioned below the metallization system 230. Moreover, the metallization layers 210, 220 may have a similar configuration as is discussed above with reference to the layers 110, 120 of the device 100 described with reference to FIGS. 1a-1b. For instance, the metallization layer 210 may comprise a dielectric material 211, such as a low-k dielectric material and the like, in which may be embedded metal lines 212, which may represent, at least in the device portion illustrated in FIG. 2a, metal lines of "narrow pitch." That is, the metal lines 212 may have a width 212W which may represent a critical dimension of the metallization layer 210, which may be approximately 100 nm and less in sophisticated applications. It should be appreciated, however, that, in other illustrative embodiments, the metal lines 212 may have a greater width depending on the overall design rules and the metallization level under consideration. Moreover, an etch stop layer 213, such as a silicon nitride layer, a silicon carbide layer, a nitrogen-enriched silicon carbide layer or any other appropriate material, may be provided with appropriate etch stop capabilities and, if required, corresponding copper confinement characteristics, as previously explained. In the manufacturing stage shown, the metallization layer 220 may be provided in the form of a non-patterned dielectric material 221, which may have any appropriate composition as required for forming therein a wide metal line, at least above the closely spaced metal lines 212. Furthermore, in the manufacturing stage shown, an etch mask 203, for instance in the form of a resist mask, is provided above the dielectric material 221 and comprises a mask opening 203A having a lateral dimension 203W that corresponds to a target lateral dimension of a via opening to be formed in the dielectric material 221. That is, the width 203W may substantially correspond to the width of a corresponding via opening at the bottom thereof so as to enable a reliable connection to one of the metal lines 212, as indicated by the dashed lines, without interfering with any adjacent metal lines 212. For example, the width 203W may be substantially equal to or less than the corresponding width 212W of the metal line 212.

The semiconductor device 200 as illustrated in FIG. 2a may be formed on the basis of process techniques as are also described above with reference to the semiconductor device 100. Thus, in some illustrative embodiments, a high degree of compatibility with conventional process techniques may be accomplished. For example, the etch mask 203 may be formed on the basis of well-established process techniques, wherein the mask opening 203A may, however, be designed to correspond with the width 212W without requiring additional layers of increased lateral size, which may frequently be used in order to suppress any deposition-related irregularities, such as the irregularities 122C as illustrated in FIG. 1b.

Figure 2B:
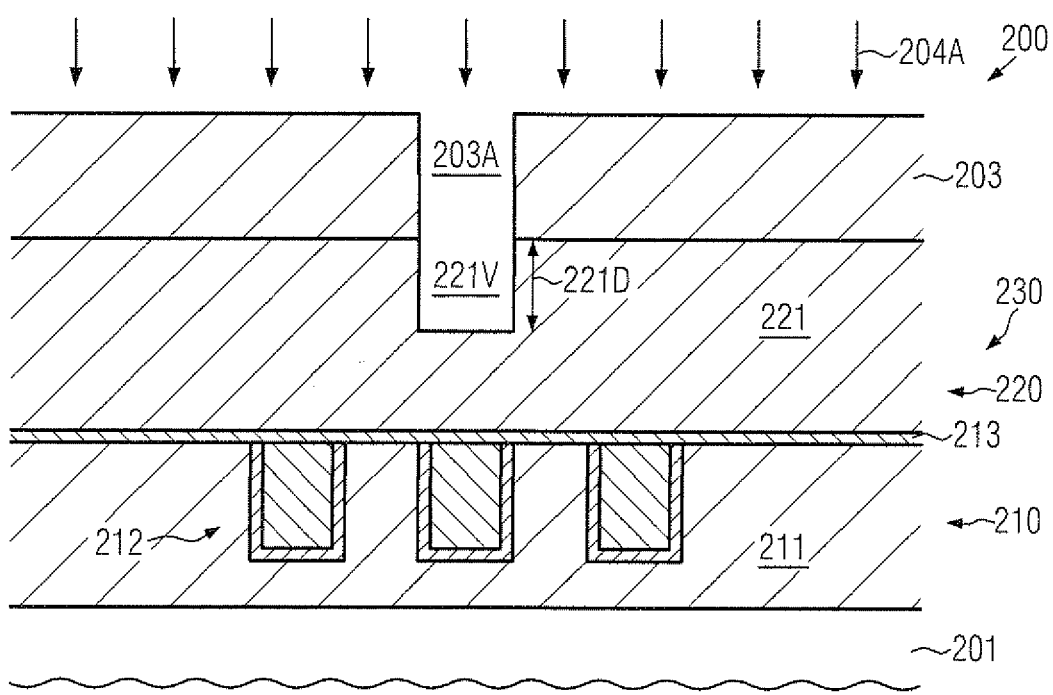

FIG. 2b schematically illustrates the semiconductor device 200 when exposed to an etch ambient 204A, which may represent an etch ambient created on the basis of well-established etch recipes. Consequently, during the etch process 204A, material of the layer 221 may be removed in a highly anisotropic manner, thereby obtaining a via opening 221V having a lateral size that substantially corresponds to the lateral size 203W (FIG. 2a) of the mask opening 203A. In some illustrative embodiments, the etch process 204A may be controlled so that the depth 221D of the via opening 221V may be approximately one third or less of a final depth of the via opening 221V, that is, a thickness of the dielectric material 221. A corresponding control of the etch process 204A may be readily accomplished by determining a removal rate for the material 221 and appropriately adjusting the process time of the etch process 204A.

Figure 2C:
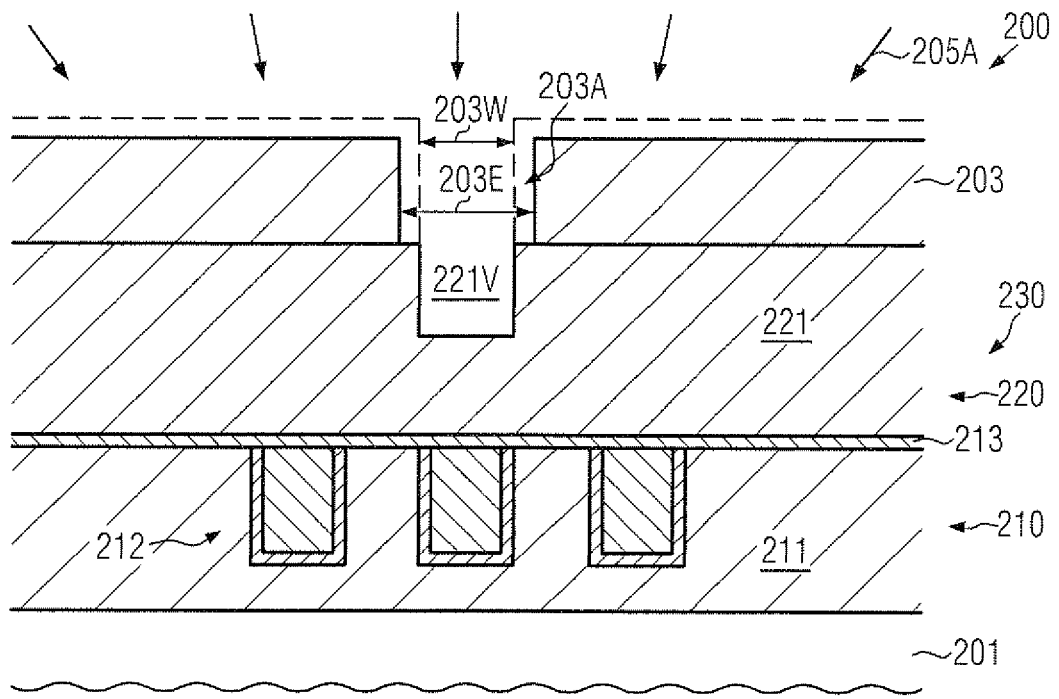

FIG. 2c schematically illustrates the semiconductor device 200 during a material removal process 205A, which is designed to remove material of the etch mask 203. For example, the process 205A may be performed as a plasma-assisted process using an oxygen species, while, in other cases, any other appropriate plasma-assisted etch ambient may be used in which organic material may be removed without removing significant portions of the dielectric material 221. In still other illustrative embodiments, the process 205A may include a wet chemical resist removal process that may be performed on the basis of well-established selective etch chemistries. Consequently, during the process 205A, the initial etch mask 203 may be eroded, thereby increasing the lateral size of the opening 203A, as is indicated by the width 203E. It should be appreciated that the increased lateral width 203E may be efficiently adjusted by determining the removal rate of the material of the etch mask 203 in the etch ambient of the process 205A and controlling the etch time. Due to the selectivity of the etch process 205A with respect to the dielectric material 221, the initial lateral width of the via opening 221V may be substantially maintained, at least at the bottom thereof.

Figure 2D:
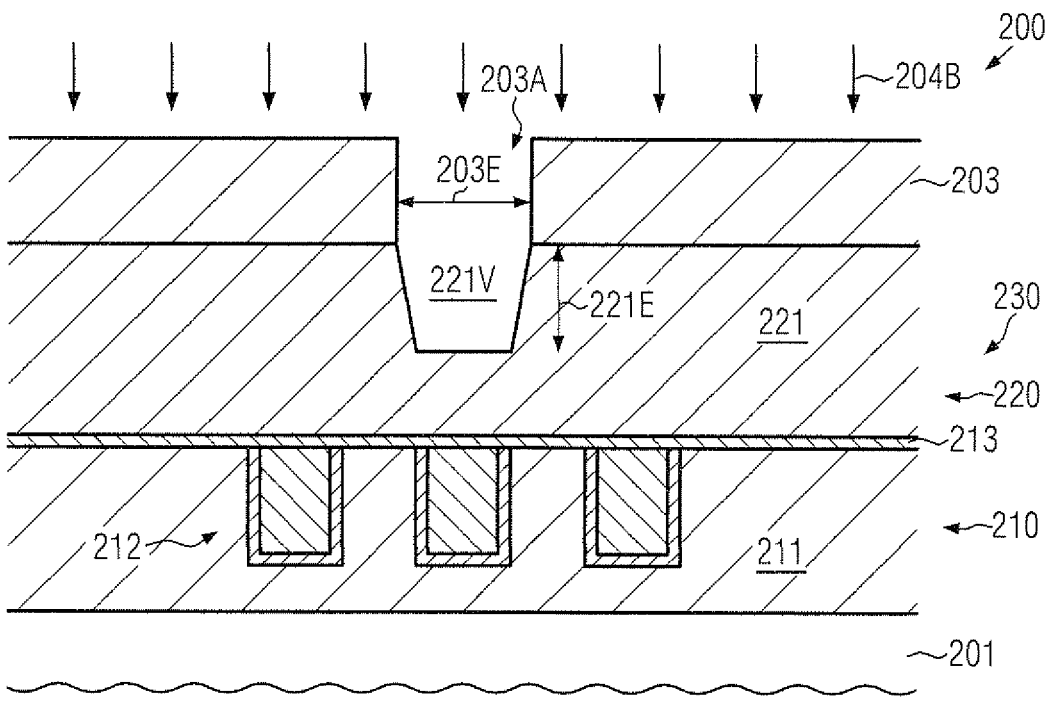

FIG. 2d schematically illustrates the semiconductor device 200 during a further etch step 204B, which may be performed on the basis of the same etch recipe as the process 204A (FIG. 2b) so that material of the layer 221 may be removed selectively to the etch mask 203. Due to the increased width 203E, a width of the via opening 221V may be increased at the top thereof, while also increasing a depth, as indicated by 221E, wherein, however, a bottom width may substantially correspond to the initial width 203W (FIG. 2c). In some illustrative embodiments, the anisotropic nature of the etch process 204B may be less pronounced compared to the process 204A, thereby obtaining a significant "rounding" of a corner or step caused by the different lateral widths 203W and 203E, thereby obtaining a more or less tapered configuration, as illustrated in FIG. 2d.

Figure 2E:
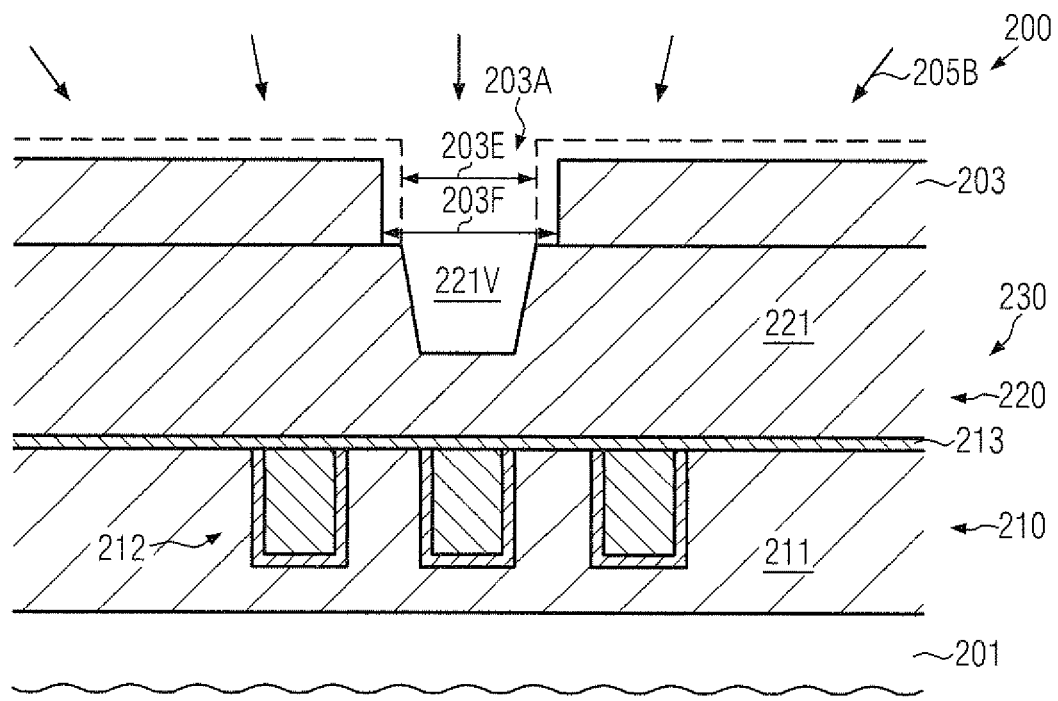

FIG. 2e schematically illustrates the semiconductor device 200 according to further illustrative embodiments in which an even more pronounced degree of tapering may be accomplished by repeating the processes 205A, 204B of FIGS. 2c-2d one or more times, depending on the degree of graduation and the degree of tapering required. For example, as illustrated, the device 200 may be exposed to a further resist erosion process 205B, thereby obtaining a further increased lateral size 203F of the mask opening 203A. For this purpose, the same or similar process recipes may be used as described above for the process 205A (FIG. 2c).

Figure 2F:
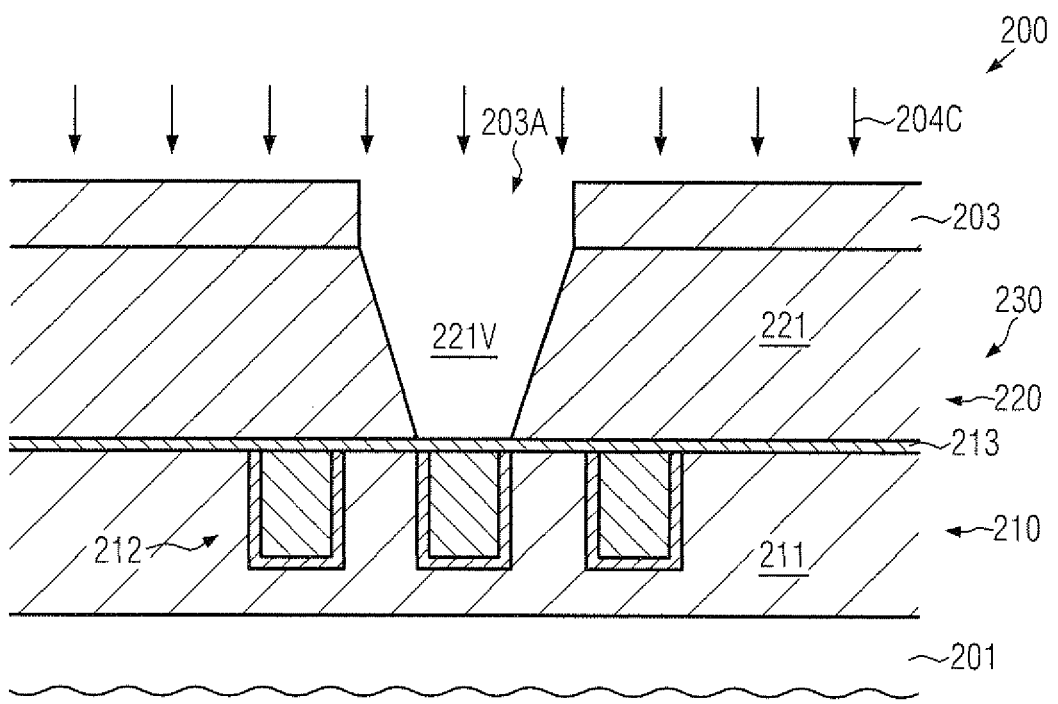

FIG. 2f schematically illustrates the semiconductor device 200 when exposed to a further etch process 204C so as to further increase the depth of the via 221V, wherein, in the embodiment shown, the via 221V may extend down to the etch stop layer 213. It should be appreciated, however, that any other depth of the via 221V may be selected, depending on the overall process strategy. If, for instance, a trench is to be formed in an upper portion of the dielectric material 221, the final etch step for forming the via opening 221V may be performed commonly with a corresponding etch step for obtaining the corresponding trench. After performing a desired number of resist erosion/etch cycles and achieving the desired depth of the via opening 221V, the further processing may be continued by removing the etch mask 203, which may be accomplished by well-established recipes, and thereafter a further etch mask may be formed so as to define the lateral size of a wide trench to be formed above the via opening 221V. For this purpose, in some cases, a corresponding film material may be deposited so as to planarize the surface topography and a corresponding etch mask may be formed on the basis of the planarized surface topography using well-established lithography techniques. Thereafter, the via opening 221V and the corresponding wide trench may be filled in a common deposition sequence, as is, for instance, also described with reference to the semiconductor device 100.

Figure 2G:
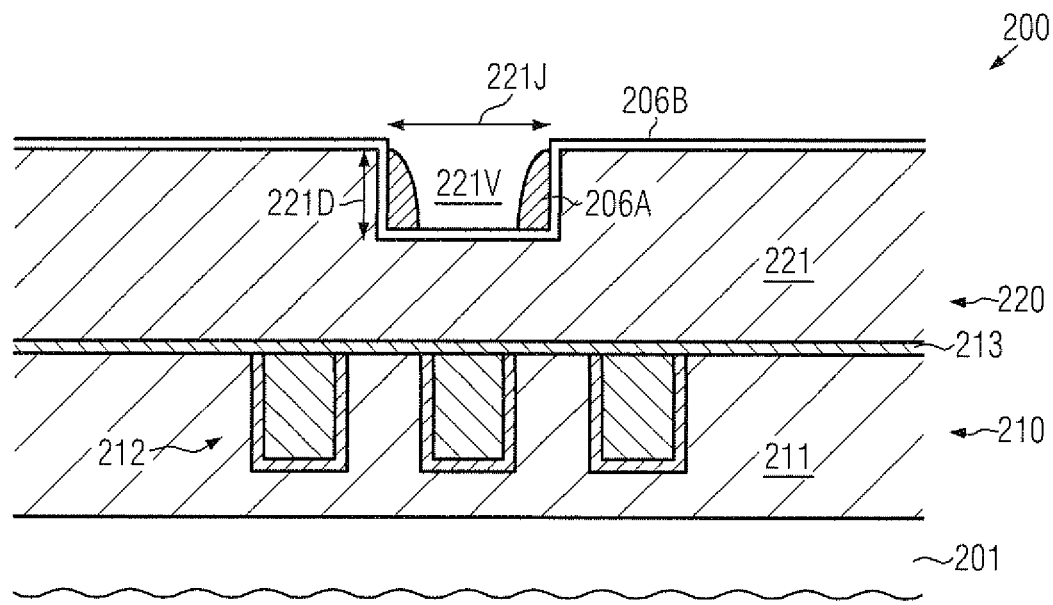
FIGS. 2g-2i schematically illustrate cross-sectional views of a semiconductor device during various manufacturing stages, in which a pronounced tapering of a via opening may be accomplished by providing an additional spacer element in the patterning sequence, according to further illustrative embodiments.

FIG. 2G schematically illustrates the semiconductor device 200 according to further illustrative embodiments in which a pronounced tapering of a via opening may be obtained on the basis of spacer elements. As illustrated, the via opening 221V may be formed in the dielectric material 221 so as to have an initial width 221J and having a first depth 221D, which may, for instance, represent approximately 40-60% of the final depth of the via opening 221V. Furthermore, in the manufacturing stage shown, spacer elements 206A may be formed on the sidewalls of the via opening 221V, wherein, in some illustrative embodiments, the spacer element 206A may be comprised of a material having a similar etch behavior as the dielectric material 221. That is, the removal rate during an etch process designed to remove material of the layer 221 may be within approximately plus/minus 10% for the material of the spacer elements 206A compared to the dielectric material 221. In one illustrative embodiment, the spacer element 206A may be formed on the basis of substantially the same material composition as the dielectric material 221. In this manner, a substantially identical etch behavior may be accomplished during the further patterning of the via opening 221V. Furthermore, in the embodiment shown, an etch stop liner 206B, such as a silicon dioxide material, a silicon nitride material and the like, may be provided, if required, with a thickness of several nanometers to approximately ten or more nanometers, depending on overall process requirements.

The semiconductor device 200 as illustrated in FIG. 2g may be formed on the basis of the following processes. After depositing the dielectric material 221, an appropriate etch mask, such as a resist mask, may be formed, which may comprise an opening having the lateral dimensions corresponding to the initial width 221J of the via opening 221V. Next, an anisotropic etch process may be performed on the basis of well-established recipes, as also previously discussed, so as to obtain the via opening 221V extending to the first depth 221D. Thereafter, the resist mask may be removed and a spacer layer (not shown) may be deposited, possibly in combination with the etch stop liner 206B, which may be accomplished by well-established deposition techniques. Next, the spacer material may be etched on the basis of, for instance, similar etch recipes as may also be used for forming the via opening 221V, due to the similarity of the etch behavior of the spacer material compared to the dielectric material 221. Consequently, the material of the spacer layer may be removed from horizontal device portions and from the center of the via opening 221V, wherein the advance of the etch front may be reliably stopped at or within the etch stop liner 206B, if provided. In this case, a certain degree of "over-etching" may be applied to obtain the pronounced rounding of the spacer elements 206A at the top of the via opening 221V. Thereafter, in some illustrative embodiments, exposed portions of the etch stop liner 206B may be removed, for instance by appropriate selected wet chemical etch recipes, plasma-assisted etch processes and the like. In other illustrative embodiments, the etch stop liner 206B may be maintained and a corresponding trench etch mask may be formed on the liner 206B.

Figure 2H:
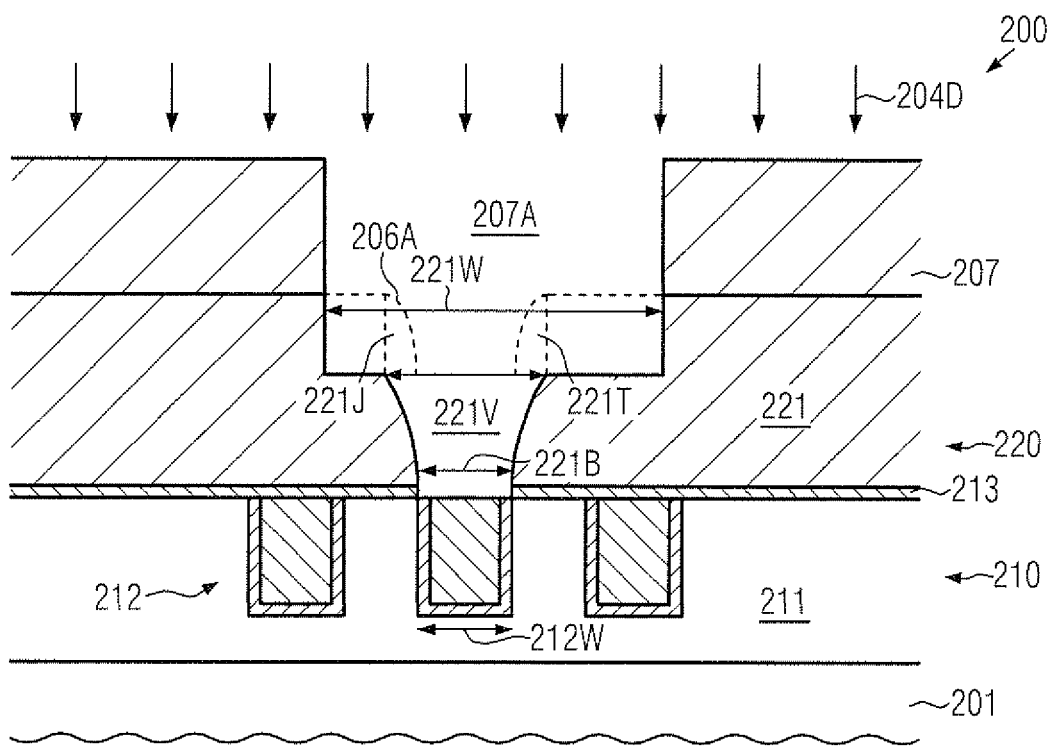

FIG. 2h schematically illustrates the semiconductor device 200 in a further advanced manufacturing stage. As illustrated, an etch mask 207 may be formed above the dielectric material 221 and may comprise an opening 207A so as to define the position and lateral size of a trench 221T formed in an upper portion of the dielectric material 221. For instance, the trench 221T may represent a wide metal line having a width 221W that may be significantly greater than the width 212W of the metal lines 212. In some illustrative embodiments, the width 221W may be twice or more the width 212W, thereby providing increased current drive capability, as previously explained.

The etch mask 207 may be formed on the basis of well-established process strategies, in which the surface topography may be planarized, if required, by an appropriate fill material and performing a lithography process for patterning a resist material in accordance with the lateral position and size of the trench 221T. It should be appreciated that the via opening 221V may not necessarily be centered in the middle of the trench 221T so that any appropriate configuration, i.e., spatial relation between the via opening 221V and the trench 221T, may be accomplished. Thereafter, the semiconductor device 200 may be exposed to an etch sequence, for instance for removing an exposed portion of any planarization material, if provided, and also etching through exposed portions of the etch stop liner 206B (FIG. 2g). Thereafter, an anisotropic etch process 204D may be performed to remove material of the layer 221 on the basis of the etch mask 207, wherein the via opening 221V is "transferred" into the lower portion of the dielectric material 221. Due to the presence of the spacer elements 206A, a pronounced tapering of the via opening 221V may be accomplished so that a reduced width 221B at the bottom of the via opening 221V may be adapted to the width 212W of the metal line 212. On the other hand, the via opening 221V may terminate into the trench 221T with a significantly increased width, which may initially be defined by the width 221J, wherein it should be appreciated that additional corner rounding may occur during the etch process 204D, thereby even further increasing the finally obtained width at the top of the via opening 221V. It should be appreciated that, during the etch process 204D, the etch stop liner 206B (FIG. 2g) may be removed since, during the etch process 204D, etch stop material 206B may be attacked from both sides, i.e., the material may be exposed by increasingly removing the spacer 206A and further removing the exposed portion of the material 221 at the opposite side of the layer 206B. After the etch process 204D, the mask 207 may be removed and the etch stop 213 may be removed in the via opening 221V in order to expose a surface portion of the metal line 212.

Consequently, also in this case, a pronounced tapering of the via opening 221V may be accomplished, thereby providing significantly enhanced surface topography for the subsequent process sequence for forming a conductive barrier layer and filling in copper or any other highly conductive material on the basis of an electrochemical deposition process.

Figure 2I:
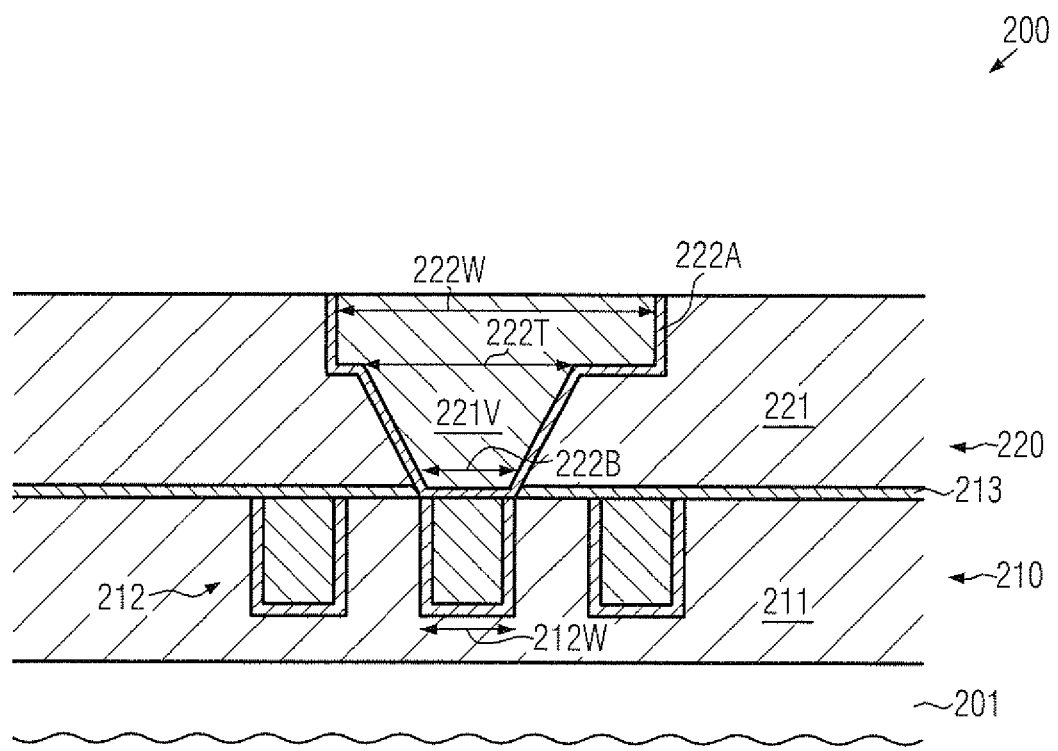

FIG. 2i schematically illustrates the semiconductor device 200 in a further advanced manufacturing stage. As illustrated, a wide metal line 222A is formed above a tapered via 221V, which connects the wide metal line 222A with one of the metal lines 212 of the lower-lying metallization layer 210. As previously shown, a width 222W of the wide metal line 222A may be significantly greater than the width 212W, thereby providing the high drive current capability of the metal line 222A. Similarly, a width 222B of the via 221V may substantially correspond to the width 212W of the metal line 212, thereby enabling a reliable electrical connection without requiring additional contact areas of increased lateral size. On the other hand, the width 222T at the top of the via 221V may be significantly greater than the bottom width 222B, thereby providing enhanced surface conditions during the filling process, as previously explained. In some illustrative embodiments, the bottom width 222B is approximately 60% or less of the top width 222T.

The semiconductor device 200 as illustrated in FIG. 2i may be formed on the basis of well-established process techniques for forming a conductive barrier material 222A, wherein the enhanced surface topography provided by the pronounced tapering of the corresponding via opening may enhance overall process uniformity and reliability. Thereafter, copper material or any other highly conductive metal may be filled in by electrochemical deposition, as previously explained with reference to the device 100, wherein a reliable bottom-to-top fill behavior may be accomplished irrespective of the significantly increased lateral dimension 222W compared to the bottom width 222B. Thereafter, any excess material may be removed, for instance by chemical mechanical polishing (CMP), and the further processing may be continued by forming a cap material on the metal line 222A and the dielectric material 221. Subsequently, any further metallization layers may be formed, if required.

As a result, the present disclosure provides techniques and semiconductor devices in which a pronounced tapering of transition vias may be accomplished by modifying an etch sequence, for instance by intermittently eroding a resist mask so as to perform two or more etch steps on the basis of a different lateral size of a corresponding mask opening. In other cases, the etch process may start with the "maximum" lateral size of the via opening, which may reduce during the further advance of the etch process on the basis of appropriately dimensioned spacer elements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming an etch mask above a dielectric material of a first metallization layer of a semiconductor device, said etch mask comprising a mask opening having a first lateral size corresponding to a target lateral size at a bottom of a via to be formed in said dielectric material;

forming a via opening on the basis of said mask opening having said first lateral size, said via opening extending to a first depth in said dielectric material;

increasing a lateral size of said mask opening from said first lateral size to a second lateral size;

increasing a depth of said via opening in said dielectric material from said first depth to a second depth on the basis of said mask opening having said second lateral size, wherein after increasing said depth, a lateral size of a top of said via opening is greater than a lateral size of a bottom of said via opening;

after increasing said depth of said via opening, forming a trench above said via opening in said dielectric material so as to connect to said via opening; and commonly filling said via opening and said trench with a metal-containing material, said via opening extending to a metal region of a second metallization layer located below said first metallization layer.

2. The method of claim 1, further comprising increasing said lateral size of said mask opening from said second lateral size to a third lateral size and further increasing said depth of said via opening in said dielectric material from said second depth to a third depth on the basis of said mask opening having said third lateral size, wherein after further increasing said depth, said lateral size of said top of said via opening is greater than said lateral size of said bottom of said via opening.

3. The method of claim 2, wherein further increasing said depth of said via opening comprises substantially continuously tapering sidewalls of said via opening from said top of said via opening to said bottom of said opening.

4. The method of claim 2, wherein after further increasing said depth of said via opening, said lateral size of said bottom of said opening is substantially the same as said first lateral size and said lateral size of said top of said opening is substantially the same as said third lateral size.

5. The method of claim 1, wherein increasing the lateral size of said mask opening comprises providing said etch mask as a resist mask and performing a resist removal process.

6. The method of claim 1, wherein forming said trench comprises forming a trench etch mask above said dielectric material and said via opening extending at least to said second depth and performing an etch process to obtain said trench and increase said depth of said via opening.

7. The method of claim 1, wherein increasing said depth of said via opening further comprises performing an etch process on the basis of said etch mask and controlling said etch process by using an etch stop layer formed below said dielectric material.

8. The method of claim 1, wherein said target lateral size is approximately equal to or less than a width of said metal region.

9. The method of claim 1, wherein said via opening extending to said first depth is formed prior to forming said trench.

10. The method of claim 1, wherein said trench is formed prior to forming said via opening.

11. The method of claim 1, wherein said first depth is approximately 30 percent of a final depth of said via opening.

12. The method of claim 1, wherein said target lateral size is approximately 100 nm or less.

13. The method of claim 1, wherein increasing said depth of said via opening comprises substantially continuously tapering sidewalls of said via opening from said top of said via opening to said bottom of said opening.

14. The method of claim 1, wherein after increasing said depth of said via opening, said lateral size of said bottom of said opening is substantially the same as said first lateral size.

15. The method of claim 1, wherein after increasing said depth of said via opening, said lateral size of said top of said opening is substantially the same as said second lateral size.

16. The method of claim 1, wherein a lateral size of said trench is greater than said lateral size of said top of said via opening.

17. A method, comprising:

forming a resist mask above a dielectric material of a metallization layer of a semiconductor device;

forming a mask opening having a first lateral size in said resist mask;

performing a first etch process to form a via opening extending to a first depth in said dielectric material using said resist mask as an etch mask, a lateral size of at least a bottom of said via opening being substantially the same as said first lateral size;

after performing said first etch process, performing a first resist removal process to increase a lateral size of said mask opening from said first lateral size to a second lateral size by removing material from at least sidewalls of said mask opening;

after performing said first resist removal process, performing a second etch process to increase a depth of said via opening from said first depth to a second depth in said dielectric material using said resist mask as an etch mask, wherein after increasing said depth, a lateral size of a top of said via opening is substantially the same as said second lateral size and a lateral size of a bottom of said via opening is less than said second lateral size;

after increasing said depth of said via opening, forming a trench in said dielectric material, wherein a lateral size of said trench is greater than said second lateral size of said via opening; and filling said via opening and said trench with a conductive material, said trench connecting to said via opening and said via opening extending to a metal region below said metallization layer.

18. The method of claim 17, wherein performing said first etch process comprises performing a substantially anisotropic etch process.

19. The method of claim 18, wherein an etch recipe used to perform said second etch process is different than an etch recipe used to perform said first etch process.

20. The method of claim 17, wherein, after increasing said depth of said via opening, sidewalls of said via opening substantially continuously taper from said top of said via opening to said bottom of said via opening.

21. The method of claim 17, wherein, after increasing said depth of said via opening, said lateral size of said bottom of said via opening is substantially the same as said first lateral size.

22. The method of claim 17, further comprising:

after performing said second etch process, performing a second resist removal process to increase a lateral size of said mask opening from said second lateral size to a third lateral size by removing material from at least sidewalls of said mask opening; and after performing said second resist removal process, performing a third etch process to increase said depth of said via opening from said second depth to a third depth using said resist mask as an etch mask, wherein after further increasing said depth of said via opening, said lateral size of said top of said via opening is substantially the same as said third lateral size and a lateral size of a bottom of said via opening is less than said third lateral size.

23. The method of claim 17, further comprising, prior to filling said via opening with said conductive material, forming a trench in said dielectric material above said contact opening and connecting to said via opening, and thereafter filling said trench and said via opening with said conductive material in a common deposition process.

24. The method of claim 23, wherein forming said trench comprises forming said trench during a common etch process that is used to expose said metal region.

25. The method of claim 17, wherein said lateral size of said via opening at a surface of said metal region is substantially the same as said first lateral size.

* * * * *